(12) United States Patent
Kang et al.

(10) Patent No.: US 10,250,254 B2
(45) Date of Patent: Apr. 2, 2019

(54) SYSTEM FOR CONTROLLING POWER DEVICE

(71) Applicant: LSIS CO., LTD., Gyeonggi-do (KR)

(72) Inventors: Sung-Hee Kang, Gyeonggi-do (KR); Gyoung-Hun Nam, Gyeonggi-do (KR); Gyu-Sung Bae, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 183 days.

(21) Appl. No.: 15/392,269

(22) Filed: Dec. 28, 2016

(65) Prior Publication Data

US 2017/0317673 A1    Nov. 2, 2017

(30) Foreign Application Priority Data

May 2, 2016    (KR) .................. 10-2016-0053906

(51) Int. Cl.
*H02J 3/36*     (2006.01)
*H03K 17/56*    (2006.01)

(52) U.S. Cl.
CPC ............... *H03K 17/56* (2013.01); *H02J 3/36* (2013.01); *Y02E 60/60* (2013.01)

(58) Field of Classification Search
CPC .................................. H02J 3/36; H03K 17/56
See application file for complete search history.

(56) References Cited

U.S. PATENT DOCUMENTS

| 2007/0008662 | A1 | 1/2007 | Bhakta |
| 2011/0222323 | A1 | 9/2011 | Dofnas et al. |
| 2014/0035365 | A1* | 2/2014 | Yoo .................. H02J 7/007 307/18 |
| 2016/0077142 | A1 | 3/2016 | Kanayama et al. |

FOREIGN PATENT DOCUMENTS

| EP | 2595013 A2 | 5/2013 |
| EP | 2930823 A1 | 10/2015 |
| JP | 2010-541521 A | 12/2010 |

(Continued)

OTHER PUBLICATIONS

Japanese Office Action dated Aug. 15, 2017 in connection with the counterpart Japanese Patent Application.

(Continued)

*Primary Examiner* — Jeffrey M Shin
(74) *Attorney, Agent, or Firm* — K&L Gates LLP

(57) ABSTRACT

The present disclosure provides a system for controlling a power device including one or more power elements, one or more drive modules configured to provide a drive signal with respect to the one or more power elements through a signal line and provided with a first wireless module, and an upper level controller configured to a control signal with respect to the one or more drive modules through a signal line and provided with a second wireless module corresponding to the first wireless module, wherein each of the one or more drive modules transmits state information of the one or more power elements and the one or more drive modules to the second wireless module through the first wireless module, and the upper level controller transmits a control signal corresponding to the state information to the first wireless module through the second wireless module.

6 Claims, 2 Drawing Sheets

(56) References Cited

FOREIGN PATENT DOCUMENTS

| | | | |
|---|---|---|---|
| JP | 2011-24390 | A | 2/2011 |
| JP | 2011-146953 | A | 7/2011 |
| JP | 5700095 | B2 | 4/2015 |
| JP | 5777537 | B2 | 9/2015 |
| KR | 100204167 | B1 | 3/1999 |
| KR | 1020120039894 | A | 4/2012 |
| KR | 101506069 | B1 | 3/2015 |
| KR | 20150130865 | A | 11/2015 |
| KR | 20160029210 | A | 3/2016 |
| KR | 20160038239 | A | 4/2016 |

OTHER PUBLICATIONS

Extended European Search Report dated Apr. 18, 2017 corresponding to application No. 16204098.4-1804.

\* cited by examiner

SYSTEM FOR CONTROLLING POWER DEVICE

CROSS REFERENCE TO RELATED APPLICATION

This application claims the benefit of Korean Patent Application No. 10-2016-0053906, filed on May. 2, 2016, entitled "SYSTEM FOR CONTROLLING POWER DEVICE", which is hereby incorporated by reference in its entirety into this application.

BACKGROUND

1. Technical Field

The present disclosure relates to a system for controlling a power device that is provided in a system such as a high voltage direct current (HVDC), an inverter, or an energy storage system (ESS).

2. Description of the Related Art

Systems such as a high voltage direct current (HVDC), an inverter, or an energy storage system (ESS) include a power device for converting or controlling electric power. The capacity of such a power device is increasing up to several thousands of amperes (A). Therefore, when abnormality occurs in the power device supplying a current of several thousands of amperes (A), it is necessary to rapidly sense the abnormality and quickly couple with it. A power device control system according to the related art transmits and receives a signal so as to monitor or control a power device in an optical signal transmission manner.

As a result, there is a problem in that there is limitation to improving a transmission speed of a signal. To address such a problem, an optical cable and the like may be additionally installed, but there are problems in that there are spatial constraints due to physical characteristics of the optical cable and additional cost is incurred for installing the optical cable.

SUMMARY

To address the above described problem, an object of the present disclosure is to provide a power device control system capable of improving reliability of an overall system by performing a dual control on a power device provided in a system such as a high voltage direct current (HVDC), an inverter, or an energy storage system (ESS).

The object of the present disclosure is not limited to the above described object, and other objects and advantages not mentioned above will be understood in the art from the following description and also will be apparently understood by an embodiment of the present disclosure. Also, it will be easily understood that the objects and advantages of the present disclosure described herein may be implemented by means and a combination thereof defined by the appended claims.

To attain the above described object, a power device control system of the present disclosure may be configured to include one or more power elements, one or more drive modules configured to provide a drive signal with respect to the one or more power elements through a signal line and provided with a first wireless module, and an upper level controller configured to transmit a control signal with respect to the one or more drive modules through a signal line and provided with a second wireless module corresponding to the first wireless module, wherein each of the one or more drive modules transmits state information of the one or more power elements and the one or more drive modules to the second wireless module through the first wireless module, and the upper level controller transmits a control signal corresponding to the state information to the first wireless module through the second wireless module.

Here, the upper level controller may be made of a hierarchical structure that is configured with two or more control modules, and a second wireless module corresponding to the first wireless module may be provided at each of the two or more control modules, and each of the two or more control modules may be configured to transmit a control signal corresponding to the state information to the first wireless module through the second wireless module.

At this point, when the one or more power elements and the one or more drive modules connected thereto respectively exist two or more, the present disclosure may be configured such that each of the two or more drive modules is provided with the first wireless module.

Also, when the one or more power elements and the one or more drive modules connected thereto respectively exist two or more, the two or more drive modules may be configured to share the single first wireless module.

In this case, when two or more power modules, each of which is configured with a structure in which the two or more power elements connected to the two or more drive modules are connected in parallel are connected in series, the power device control system of the present disclosure may be configured such that the single first wireless module is provided at each of the two or more power modules, and the two or more drive modules connected to the two or more power elements configuring the two or more power modules may be configured to share the single first wireless module.

As described above, in accordance with the present disclosure, there is an advantage in which reliability of an overall system may be improved by performing a dual control on a power device provided in a system such as an HVDC, an inverter, or an ESS.

That is, the present disclosure has an advantage capable of implementing a dual control by applying not only a wired control method using a conventional optical signal transmission method and but also a wireless control method using a wireless module. Consequently, without additionally installing an optical cable, a signal transmission speed for controlling or monitoring a power device may be increased. Therefore, in comparison with an additional installation of an optical cable, there is an advantage in which efficiency of a dual control in space and cost may be provided.

Also, a control of a power device may be performed by not only a next upper system provided with a wireless module but also an upper system. That is, the control of a power device may be performed in double. As a result, even when abnormality occurs in the upper system, a control of a power system may be performed by the next upper system instead of the upper system so that reliability of an overall system may be improved.

DETAILED DESCRIPTION

Figure 1:
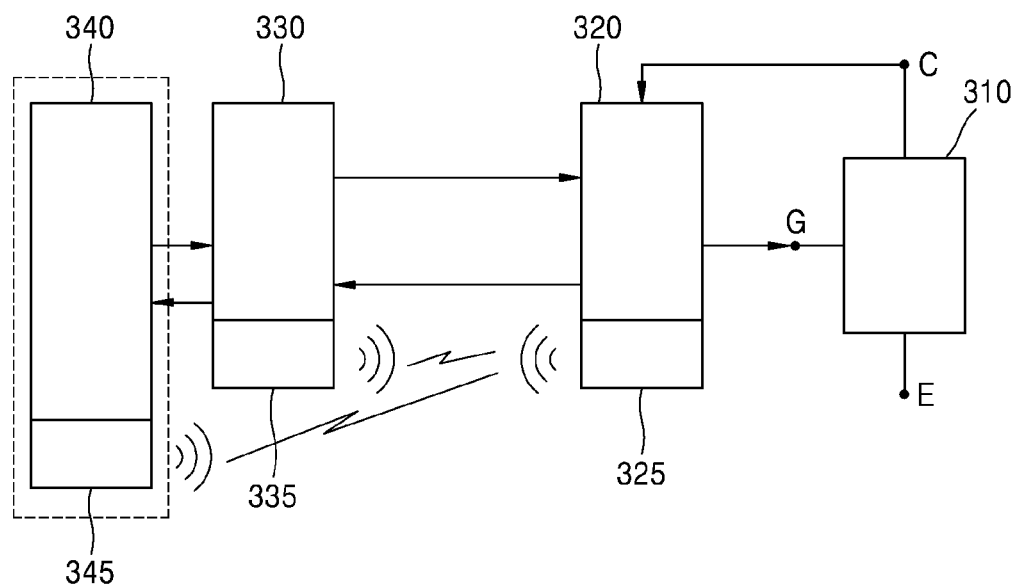
FIG. 1 is a conceptual diagram illustrating a configuration of a power device control system according to one embodiment of the present disclosure.

The above and other objects, features and advantages of the present disclosure will be described later in detail with reference to the accompanying drawings, and thus the technical spirit of the present disclosure can be easily implemented by those skilled in the art. In the following description of the present disclosure, if a detailed description of known configurations and functions is determined to obscure the interpretation of embodiments of the present disclosure, the detailed description thereof will be omitted.

Hereinafter, preferred embodiments according to the present disclosure will be described in detail with reference to the accompanying drawings. In the drawings, the same reference numerals refer to the same or similar elements throughout.

FIG. 1 is a conceptual diagram illustrating a configuration of a power device control system according to one embodiment of the present disclosure.

Referring to FIG. 1, the power device control system according to one embodiment of the present disclosure includes a power element 310, a driving module 320, and an upper level controller 330. Further, the power device control system may further include a next upper level controller 340.

The power element 310 may be implemented by an insulated gate bipolar transistor (IGBT) or a power metal oxide silicon field effect transistor (MOSFET). Further, the power element 310 may be an element made of SiC or GaN.

The driving module 320 supplies a drive signal to the power element 310 based on a control signal of the upper level controller 330.

The power element 310 is driven to be turned on and off based on the drive signal of the driving module 320, which is applied to a gate terminal G.

Further, through a signal line connecting a collector terminal C of the power element 310 to the driving module 320, information with respect to a state of the collector terminal C of the power element 310 is fed back to the driving module 320. At this point, a protective diode or other circuit configuration may be additionally provided at the signal line between the collector terminal C of the power element 310 and the driving module 320.

The driving module 320 transmits information (hereinafter, referred to as an "error feedback signal") with respect to a state of the power element 310 and a state of the driving module 320 to the upper level controller 330.

The upper level controller 330 transmits a control signal to the driving module 320 and receives the error feedback signal therefrom.

According to the embodiment of the present disclosure, the driving module 320 is provided with a first wireless module 325 and the upper level controller 330 is provided with a second wireless module 335 corresponding to the first wireless module 325. Further, the next upper level controller 340 is provided with a third wireless module 345 corresponding to at least one of the first and second wireless modules 325 and 335.

Here, each of the first and second wireless modules 325 and 335 is provided for implementing a conventional wireless communication method such as a wireless fidelity (Wi-Fi), Bluetooth, or the like.

Hereinafter, an operation process of the power device control system according to the embodiment of the present disclosure will be described below.

The next upper level controller 340 provides a control signal with respect to the driving module 320 or the upper level controller 330 through the signal line.

The upper level controller 330 transmits a control signal for controlling the driving module 320 thereto. At this point, the control signal may be transmitted in a wired manner such as an optical signal and the like.

The driving module 320 receives the control signal of the upper level controller 330 and outputs a drive signal on the basis of the control signal.

The power element 310 is driven to be turn on and off on the basis of the drive signal.

The power element 310 transmits information with respect thereto to the driving module 320. Illustratively, information with respect to a state of the collector terminal C of the power element 310 may be transmitted to the driving module 320.

The driving module 320 generates an error feedback signal, which is a result of monitoring a state of each of the power element 310 and the driving module 320, on the basis of information with respect to a state of the power element 310 and a state of the driving module 320, and transmits the generated error feedback signal to the upper level controller 330.

Illustratively, the power element 310 performs an ON/OFF operation through an input voltage and an input current of the gate terminal G, and an input ON/OFF state of the power element 310 is determined by a voltage difference between a gate G and an emitter E. Such an ON/OFF control is driven in an ON state at a conventional voltage difference between about 12 to 20 volts (V), and in an OFF state at 0V or below.

In the ON state, a voltage difference between the collector C and the emitter E may be lowered within 2 to 3 V, and a variation at the voltage difference between the collector C and the emitter E in the ON state may occur according to a drive current.

However, when a voltage difference between the collector C and the emitter E is increased in the ON state, it may be departed from a Safe Operation Area (SOA) of the power element 310. Therefore, the driving module 320 may verify a state of the power element 310 on the basis of a feedback signal corresponding to a state of the collector terminal C, and may transmit information with respect to a state of the power element 310 to the upper level controller 330 as an error feedback signal.

Illustratively, when a protective diode exists in a circuit unit at the collector terminal C, the protective diode is turned off when a voltage of the collector terminal C is higher than that of a feedback stage and is turned on when the voltage of the collector terminal C is lower than that of the feedback stage. As a result, a voltage value of the collector terminal C of the power element 310 may be transmitted to the driving module 320.

As described above, the driving module 320 according to the embodiment of the present disclosure is provided with the first wireless module 325, and the upper level controller 330 and the next upper level controller 340 are provided with the second and third wireless modules 335 and 345, respectively, which correspond to the first wireless module 325.

Consequently, the driving module 320 may transmit state information of the power element 310 and the driving module 320 to not only the second wireless module 335 but also the third wireless module 345 through the first wireless module 325. In this case, the next upper level controller 340 may transmit a control signal with respect to the driving module 320 or the upper level controller 330 on the bases of the state information to the first wireless module 325 or the second wireless module 335 through the third wireless module 345.

For reference, the power device control system according to one embodiment of the present disclosure may selectively include the next upper level controller 340 according to a configuration formation of the system. Further, although not shown in FIG. 1, the power device control system according to one embodiment of the present disclosure may further include a controller, which is an upper layer than the next upper level controller 340, to include a control module configured with a multilayer structure of over three layers.

In addition, similar to the upper level controller 330 and the next upper level controller 340, the controller which is an upper layer than the next upper level controller 340 may transmit a control signal with respect to a lower level controller or the driving module 320 using a wireless module corresponding to the first wireless module 325.

As a result, the driving module 320 may be directly inspected by at least one of the upper level controller 330 and at least one controller 340 that is an upper level than the upper level controller 330 through the first wireless module 325 of the driving module 320.

Therefore, a rapid verification with respect to system state information including a connection state of the power element 310 and a protection coordination according to the rapid verification may be possible so that reliability of an overall power device control system may be improved.

Consequently, according to one embodiment of the present disclosure, when a problem occurs in a large-scale system and the like, a part at which abnormality occurs is rapidly and accurately determined so that an efficient maintenance of a system may be possible. Also, there is an advantage in which a facility configuration may be possible with a low cost without a spatial limitation compared to a configuration of a dual control system using only an optical signal.

Hereinafter, examples of various system configurations according to the embodiment of the present disclosure will be described with reference to FIGS. 2 to 4.

Figure 2:
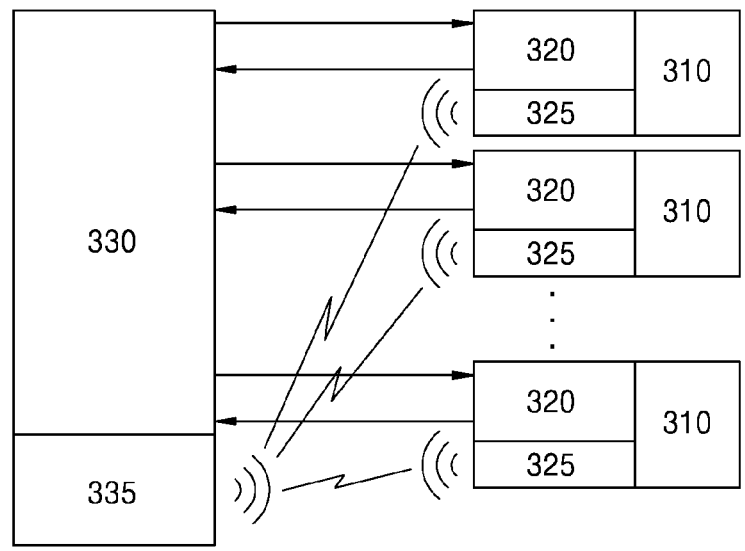
FIGS. 2 to 4 are exemplary diagrams of various system configurations applying the power device control system of FIG. 1, respectively.
Figure 3:
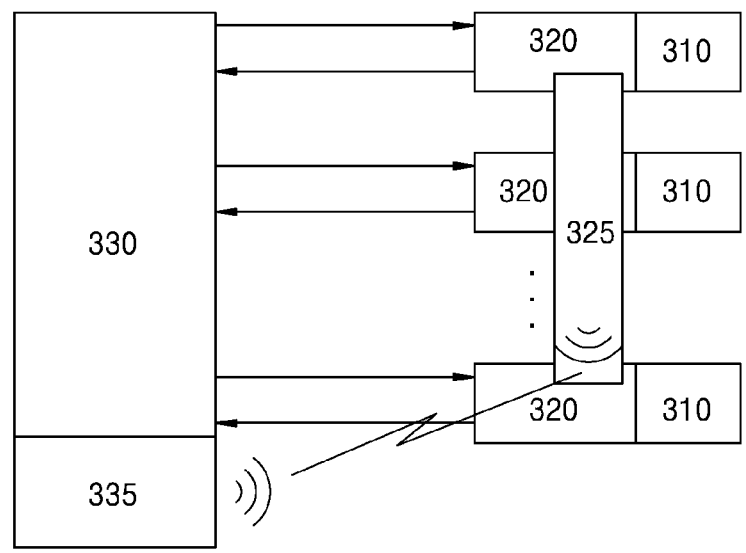
Figure 4:
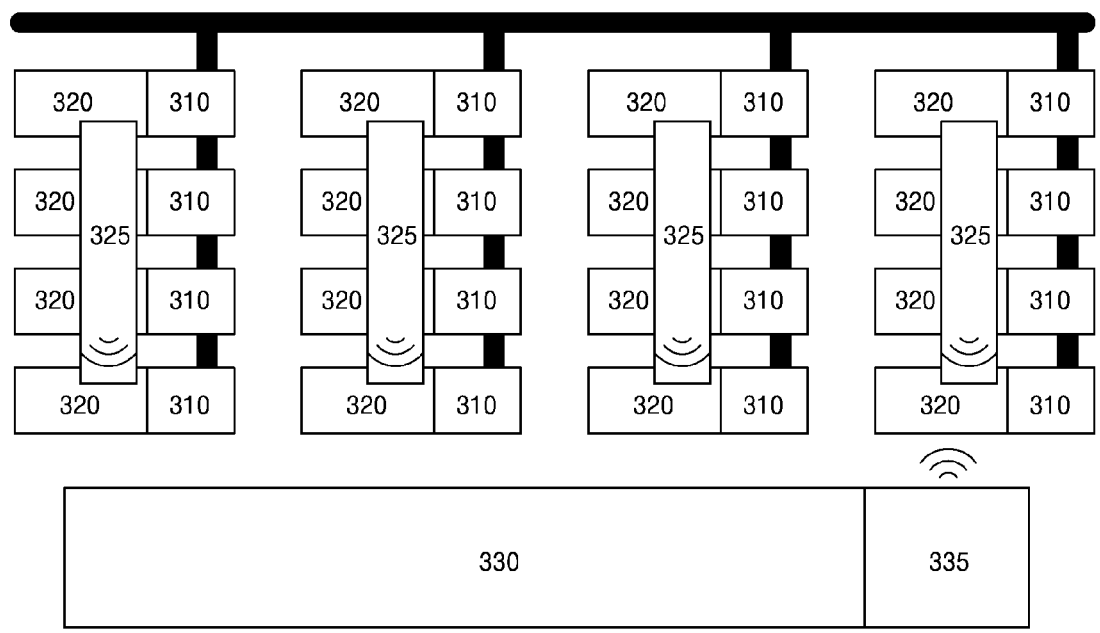

FIGS. 2 to 4 are exemplary diagrams of various system configurations applying the power device control system of FIG. 1, respectively.

Firstly, referring to FIG. 2, a single upper level controller 330 according to the present disclosure may be connected to a plurality of driving modules 320.

Each of the driving modules 320 generates a drive signal and the like with respect to the power element 310 being directly connected thereto, and is provided with a separate wireless module 325.

The upper level controller 330 is provided with a single wireless module 335 and may transmit and receive wireless data to and from the wireless module 325 provided at each of the driving modules 320 through the single wireless module 335.

Referring to FIG. 3, it can be seen a configuration in which two or more driving modules 320 commonly use a single wireless module 325.

That is, for a configuration of a high output system and the like, a system in which two or more power elements 310 are connected in series and in parallel with each other may be provided. In this case, a plurality of power elements may be modularized according to each position and a connection relationship, and the driving modules 320 connected to the power elements 310 configuring each module may be configured to share the single wireless module 325.

In this case, there are provided an effect in which an operation efficiency is improved according to a dual control scheme establishment with respect to a power device and also an additional effect in which a cost for a system configuration is reduced.

In FIG. 4, an exemplary diagram with respect to a serial-parallel hybrid configuration of the power element 310.

Referring to FIG. 4, it can be seen that four power elements 310 configures a power module through a parallel connection and four power modules are connected in series to form a power stage of a system.

That is, 16 number of wireless modules 325 may be provided in a power device which is configured with 16 number of power elements 310 and 16 number of driving modules 320 connected thereto, but, for convenience of a system configuration and a cost reduction, it can be seen that a single wireless module 325 is provided at each power module and 4 number of the driving modules 320 in each power module share the single wireless module 325.

However, the configurations of FIGS. 2 to 4 are exemplary configuration diagrams of a system implementable by the embodiment of the present disclosure, respectively, but the present disclosure is not limited thereto.

For reference, according to a development of a future wireless technology, it may be apparent that a control of a power system can be implemented to configure and perform through only a wireless manner, and further it may be possible that a method of a dual wireless control configuration may be applicable by providing with two or more wireless modules.

In accordance with the present disclosure as described above, a dual control system is implemented by adding a wireless module so that there are provided various effects in which efficiency in space and cost may be dramatically increased in comparison with a dual control method employing an addition of an optical module, and reliability of a system may be dramatically improved through a multiple control with respect to a power element.

Although the present disclosure has been described with reference to the embodiments, it should be understood that numerous other substitutions, modifications and alterations can be devised by those skilled in the art without departing the technical spirit of this disclosure, and thus it should be construed that the present disclosure is not limited by the embodiments described above and the accompanying drawings.

What is claimed is:

1. A system for controlling a power device, comprising:
one or more power elements;
one or more drive modules configured to provide a drive signal with respect to the one or more power elements through a signal line; and
an upper level controller configured to transmit a control signal with respect to the one or more drive modules through a signal line,
wherein each of the one or more drive modules is provided with a first wireless module,
wherein the upper level controller is provided with a second wireless module corresponding to the first wireless module,
wherein each of the one or more drive modules is configured to transmit state information of the one or more power elements and the one or more drive modules to the second wireless module through the first wireless module,
wherein the upper level controller is configured to transmit a control signal corresponding to the state information to the first wireless module through the second wireless module,
wherein each of the one or more drive modules is configured to transmit an error feedback signal with respect to a state of the one or more power elements and a state of the one or more drive modules to the upper level controller, and generate the drive signal with respect to the one or more power elements being directly connected thereto.

2. The system of claim 1, further comprising:
at least one controller which is an upper layer than the upper level controller and configured to perform a reception of the state information and a transmission of a control signal with respect to the one or more drive modules through a wireless module corresponding to the first wireless module.

3. The system of claim 1, wherein, when the one or more power elements and the one or more drive modules connected thereto respectively exist two or more, each of the two or more drive modules is provided with the first wireless module.

4. The system of claim 1, wherein, when the one or more power elements and the one or more drive modules connected thereto respectively exist two or more, the two or more drive modules share the first wireless module.

5. The system of claim 1, wherein, when two or more power modules, each of which is configured with a structure in which the two or more power elements connected to the two or more drive modules are connected in parallel are connected in series, each of the two or more power modules includes the first wireless module which is shared by the two or more drive modules.

6. The system of claim 1, further comprising:
a next upper controller configured to provide a control signal with respect to the one or more drive modules and the upper level controller through a signal line and provided with a third wireless module corresponding to the first wireless module and the second wireless module,
wherein each of the one or more drive modules is configured to transmit the state information of the one or more power elements and the one or more drive modules to the third wireless module through the first wireless module, and
the next upper controller is configured to transmit a control signal corresponding to the state information to the first wireless module or the second wireless module through the third wireless module.

* * * * *